(12) United States Patent
Ohara

(10) Patent No.: US 12,048,185 B2
(45) Date of Patent: Jul. 23, 2024

(54) DISPLAY DEVICE INCLUDING RESIN FILLED DAM SPACES

(71) Applicant: Japan Display Inc., Tokyo (JP)

(72) Inventor: Hiroki Ohara, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 421 days.

(21) Appl. No.: 17/185,967

(22) Filed: Feb. 26, 2021

(65) Prior Publication Data

US 2021/0184171 A1   Jun. 17, 2021

Related U.S. Application Data

(63) Continuation of application No. PCT/JP2019/021397, filed on May 29, 2019.

(30) Foreign Application Priority Data

Aug. 31, 2018   (JP) .................. 2018-163040

(51) Int. Cl.
*H10K 50/84*     (2023.01)
*H10K 50/842*    (2023.01)
(Continued)

(52) U.S. Cl.
CPC ....... *H10K 50/844* (2023.02); *H10K 50/8426* (2023.02); *H10K 59/40* (2023.02);
(Continued)

(58) Field of Classification Search
CPC .. H10K 50/844; H10K 50/8426; H10K 50/87; H10K 50/868; H10K 50/17;
(Continued)

(56) References Cited

U.S. PATENT DOCUMENTS 10,431,778 B2 * 10/2019 Gwon .................. H10K 59/124
10,658,439 B2 *  5/2020 Hanari ............... H10K 50/8445
(Continued)

FOREIGN PATENT DOCUMENTS

CN    106775173 A    5/2017
CN    108039418 A    5/2018
(Continued)

OTHER PUBLICATIONS

International Search Report and Written Opinion mailed on Aug. 27, 2019, received for PCT Application PCT/JP2019/021397 Filed on May 29, 2019, 9 pages including English Translation.
(Continued)

*Primary Examiner* — Ida M Soward
(74) *Attorney, Agent, or Firm* — XSENSUS LLP

(57) ABSTRACT

The display device includes: a display area; a first peripheral area disposed outside the display area; a second peripheral area disposed outside the first peripheral area; an inner dam disposed in the first peripheral area; an outer dam disposed outside the inner dam in the first peripheral area; a resin part formed between the inner dam and the outer dam so as to be higher than the inner dam and the outer dam; and a sealing film disposed so as to overlap with the display area in a plan view. An outer edge of the sealing film overlaps with the resin part or the outer dam in a plan view.

2 Claims, 14 Drawing Sheets

US 12,048,185 B2
Page 2

(51) Int. Cl.
| | |
|---|---|
| *H10K 50/844* | (2023.01) |
| *H10K 59/12* | (2023.01) |
| *H10K 59/40* | (2023.01) |
| *H10K 71/00* | (2023.01) |
| *G06F 1/16* | (2006.01) |
| *G09F 9/30* | (2006.01) |
| *H10K 50/15* | (2023.01) |
| *H10K 50/16* | (2023.01) |
| *H10K 50/17* | (2023.01) |
| *H10K 50/80* | (2023.01) |
| *H10K 50/813* | (2023.01) |
| *H10K 50/87* | (2023.01) |
| *H10K 59/121* | (2023.01) |
| *H10K 59/123* | (2023.01) |
| *H10K 59/35* | (2023.01) |
| *H10K 59/80* | (2023.01) |
| *H10K 77/10* | (2023.01) |
| *H10K 102/00* | (2023.01) |

(52) U.S. Cl.
CPC ........... *H10K 71/00* (2023.02); *G06F 1/1652* (2013.01); *G09F 9/301* (2013.01); *G09G 2300/0408* (2013.01); *G09G 2300/0804* (2013.01); *G09G 2380/02* (2013.01); *H05K 2201/09909* (2013.01); *H10K 50/15* (2023.02); *H10K 50/16* (2023.02); *H10K 50/17* (2023.02); *H10K 50/171* (2023.02); *H10K 50/813* (2023.02); *H10K 50/868* (2023.02); *H10K 50/87* (2023.02); *H10K 59/1213* (2023.02); *H10K 59/1216* (2023.02); *H10K 59/123* (2023.02); *H10K 59/35* (2023.02); *H10K 59/873* (2023.02); *H10K 77/111* (2023.02); *H10K 2102/311* (2023.02)

(58) Field of Classification Search
CPC ...... H10K 50/171; H10K 50/15; H10K 50/16; H10K 50/813; H10K 59/131; H10K 59/40; H10K 59/873; H10K 59/123; H10K 59/35; H10K 59/1213; H10K 59/1216; H10K 77/111; H10K 2102/311; H05B 33/04; H05B 33/12; H05B 33/22; G06F 1/1652; G09F 9/00; G09F 9/30; G09F 9/301; G09G 2300/0408; G09G 2300/0804; G09G 2380/02; H05K 2201/09909
See application file for complete search history.

(56) References Cited

U.S. PATENT DOCUMENTS

| | | | | |
|---|---|---|---|---|
| 10,707,282 | B1* | 7/2020 | Yang | H10K 50/84 |
| 10,817,090 | B2* | 10/2020 | Gwon | G06F 3/0412 |
| 2014/0117363 | A1* | 5/2014 | Koresawa | H01L 27/124 |
| | | | | 438/158 |
| 2014/0132148 | A1 | 5/2014 | Jang et al. | |
| 2015/0228927 | A1 | 8/2015 | Kim | |
| 2015/0380685 | A1 | 12/2015 | Lee et al. | |
| 2016/0336541 | A1* | 11/2016 | Kim | H10K 50/8426 |
| 2017/0168342 | A1* | 6/2017 | Park | G02F 1/1334 |
| 2017/0244036 | A1 | 8/2017 | Okawara | |
| 2017/0345881 | A1* | 11/2017 | Kim | H10K 59/123 |
| 2018/0061899 | A1* | 3/2018 | Oh | H10K 59/124 |
| 2018/0122890 | A1* | 5/2018 | Park | H10K 59/1315 |
| 2018/0138450 | A1* | 5/2018 | Park | H10K 59/35 |
| 2018/0151838 | A1* | 5/2018 | Park | G06F 3/0412 |
| 2018/0226454 | A1* | 8/2018 | Liu | H10K 59/40 |
| 2018/0350884 | A1* | 12/2018 | Won | G06F 3/0412 |
| 2019/0019966 | A1* | 1/2019 | Jiang | H10K 77/111 |
| 2019/0067629 | A1* | 2/2019 | Wu | H10K 71/00 |

FOREIGN PATENT DOCUMENTS

| | | | | |
|---|---|---|---|---|
| CN | 108364987 | A * | 8/2018 | ............ H10K 59/12 |
| CN | 207719213 | U * | 8/2018 | ........... H10K 59/122 |
| CN | 110120465 | A * | 8/2019 | ............ H10K 59/12 |
| JP | 2008-38178 | A | 2/2008 | |
| JP | 2011-76759 | A | 4/2011 | |
| JP | 2012-31473 | A | 2/2012 | |
| JP | 2016-3383 | A | 1/2016 | |
| JP | 2016-3384 | A | 1/2016 | |
| JP | 2017-150017 | A | 8/2017 | |

OTHER PUBLICATIONS

Chinese Office Action issued Jan. 10, 2024, in corresponding Chinese Patent Application No. 201980055857.4, 16 pages.

* cited by examiner

DISPLAY DEVICE INCLUDING RESIN FILLED DAM SPACES

CROSS-REFERENCE TO RELATED APPLICATION

The present application is Bypass Continuation of International Application No. PCT/JP2019/021397, filed on May 29, 2019, which claims priority from Japanese Application No. JP2018-163040 filed on Aug. 31, 2018. The contents of these applications are hereby incorporated by reference into this application.

BACK GROUND OF THE INVENTION

1. Field of the Invention

The present invention relates to a display device and a method of manufacturing the display device.

2. Description of the Related Art

A display element of a display device, such as an organic EL display device, may deteriorate due to impurities, such as moisture entering inside thereof. To prevent entering of the impurities, for example, a sealing film of a laminate of an inorganic film and an organic film is provided.

A method of disposing and curing liquid resin is known as a method of forming an organic film contained in a sealing film. In this case, a dam agent is provided to prevent the liquid resin from overflowing from a predetermined area (see US2015/0228927A, US2014/0132148A, US2015/0380685A). Further, a CVD method is known as a method of forming an inorganic film contained in a sealing film. In this case, the inorganic film may be formed in a predetermined area using a mask (see JP2008-038178A, JP2016-003383A, JP2016-003384A, JP2011-076759A, JP2017-150017A, JP 2012-031473A).

SUMMARY OF THE INVENTION

In a case where a sealing film is formed by the CVD method with a mask, the sealing film is formed while the mask is away from a substrate. This is to protect the films on the substrate from being damaged due to contact with the mask. At this time, a material for forming the sealing film may flow into a gap between the mask and the substrate, and the sealing film may be formed to the edge of the substrate. If there is a subsequent step of cutting the substrate along the cut line, the sealing film may be cracked and the display device may be less reliable.

Specifically, in recent years, a thin display device may be manufactured using a flexible substrate so as to be curved. In the case where the sealing film is formed by the CVD method using a mask, the sealing film is also formed in an area to be curved if the mask and the substrate are not aligned accurately or if a material of the sealing film is adhered between the mask and the substrate. In the case where the sealing film is formed in the area to be curved, the sealing film may be cracked and the display element may be deteriorated.

One or more embodiments of the present invention have been conceived in view of the above, and an object thereof is to provide a display device and a method of manufacturing the display device with reduced risk of a crack in a sealing film.

According to one aspect of the present invention, there is provided a display device. The display device includes: a display area; a first peripheral area disposed outside the display area; a second peripheral area disposed outside the first peripheral area; an inner dam disposed in the first peripheral area; an outer dam disposed outside the inner dam in the first peripheral area; a resin part formed between the inner dam and the outer dam so as to be higher than the inner dam and the outer dam; and a sealing film disposed so as to overlap with the display area in a plan view. An outer edge of the sealing film overlaps with the resin part or the outer dam in a plan view.

In one embodiment of the present invention, the display device further includes a touch sensor including an electrode and a routing wire, the electrode being disposed so as to overlap with the sealing film, the routing wire being electrically connected to the electrode and disposed in the first peripheral area. The resin part has a recess in an area overlapping the routing wire in a plan view.

In one embodiment of the present invention, the display device further includes a covering resin disposed on the resin part.

According to another aspect of the present invention, there is provided a method of manufacturing method for a display device. The method includes steps of: preparing a substrate including a display area and a first peripheral area disposed outside the display area; disposing a dam agent in the first peripheral area; patterning the dam agent to form an inner dam and an outer dam; forming a resin part between the inner dam and the outer dam to be higher than the inner dam and the outer dam; disposing a mask on the resin part such that an edge of the mask is positioned on the resin part to form a sealing film in the display area; and curving the display device in an area outside the first peripheral area.

In one embodiment of the present invention, the method further includes a step of cutting out a piece of a display device from a large plate on which a plurality of display devices are formed.

In one embodiment of the present invention, the mask is disposed in contact with the resin part.

In one embodiment of the present invention, the method further includes a step of forming a covering resin on the resin part.

DETAILED DESCRIPTION OF THE INVENTION

Figure 1:
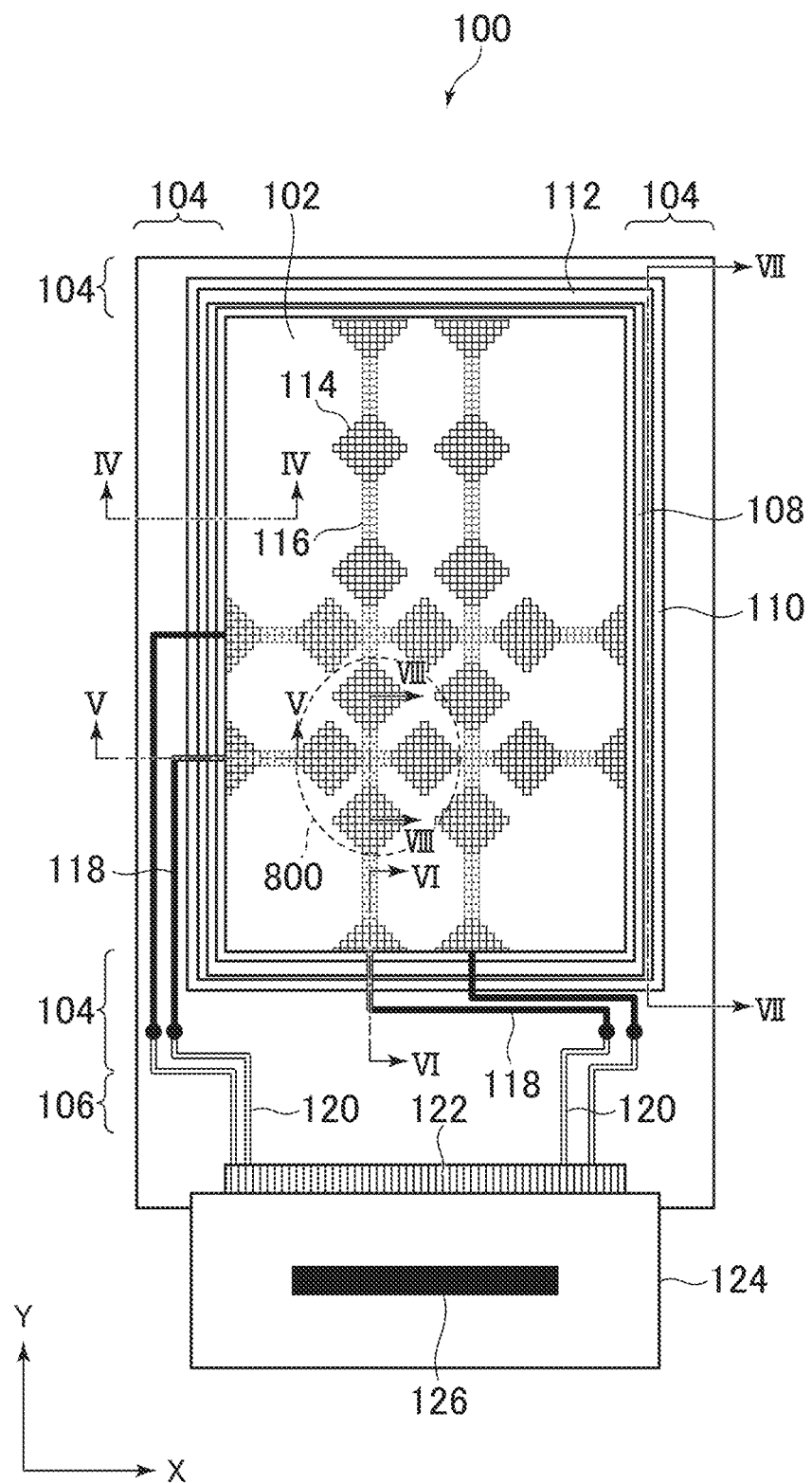
FIG. 1 is a schematic diagram illustrating a display device according to an embodiment of the present invention.

Embodiments of the present invention will be described below referring to the drawings. The disclosure is merely an example, and appropriate modifications while keeping the gist of the invention that can be easily conceived by those skilled in the art are naturally included in the scope of the invention. The accompanying drawings may schematically illustrate widths, thicknesses, shapes, or other characteristics of each part for clarity of illustration, compared to actual configurations. However, such a schematic illustration is merely an example and not intended to limit the present invention. In this specification and each drawing, the same elements as those already described with reference to the already-presented drawings are denoted by the same reference numerals, and detailed description thereof may be appropriately omitted.

Further, in the detailed description of the embodiments of the present invention, when a positional relationship between a component and another component is defined, if not otherwise stated, the words "on" and "below" suggest not only a case where the another component is disposed immediately on or below the component, but also a case where the component is disposed on or below the another component with a third component interposed therebetween.

FIG. 1 is a plan view of an example of a display device 100 according to an embodiment. An organic EL display device will be taken as an example of the display device 100.

The display device 100 includes a display area 102, a first peripheral area 104, and a second peripheral area 106. Specifically, the display area 102 is composed of pixels including a light-emitting area. In the display area 102, pixels configured by combining unit pixels (sub-pixels) of a plurality of colors such as red (R), green (G), and blue (B) are arranged in the form of a matrix. A full-color image is displayed by the pixels.

Figure 9:
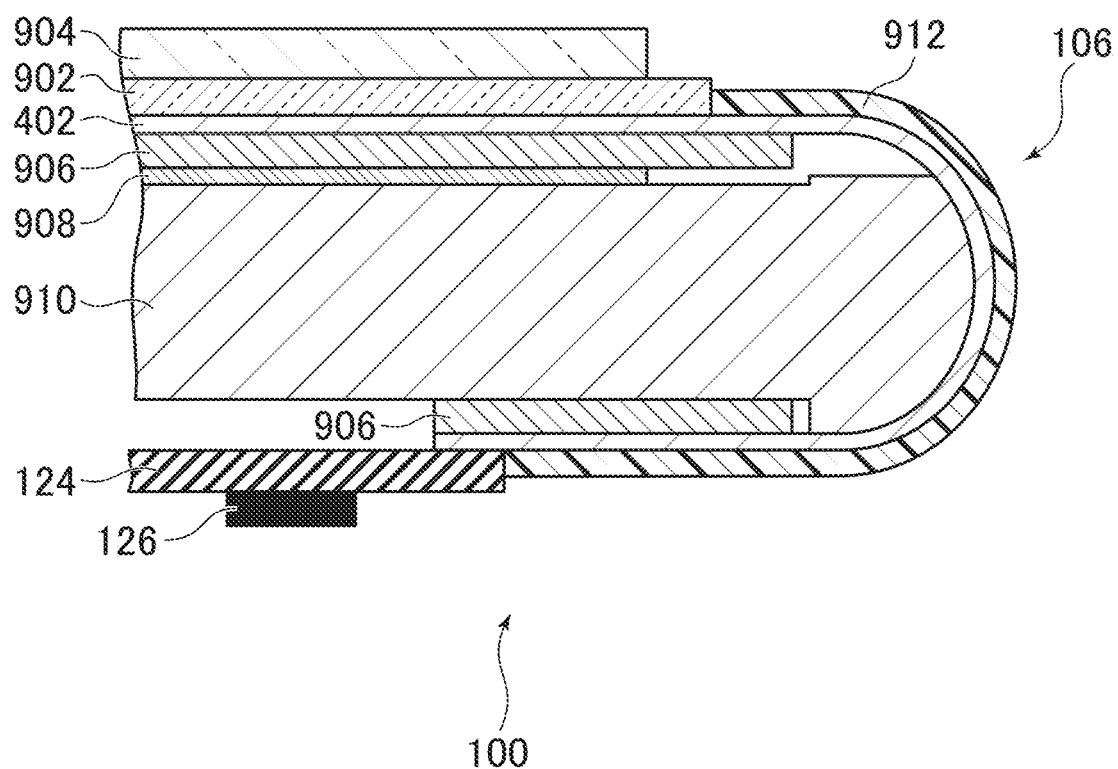
FIG. 9 is a diagram illustrating a curved display device.

The first peripheral area 104 is disposed outside the display area 102. Specifically, the first peripheral area 104 is disposed on both sides of the display area 102 in a X direction and a Y direction. The X direction is a horizontal direction in FIG. 1, and the Y direction is a vertical direction in FIG. 1. The second peripheral area 106 is provided outside the first peripheral area 104 in at least one location. In the present embodiment, the second peripheral area 106 is provided below the first peripheral area 104 and is curved as shown in FIG. 9.

The display device 100 includes an inner dam 108, an outer dam 110, a resin part 112, a touch sensor, a terminal part 122, a FPC 124, and a drive IC 126. The inner dam 108 is disposed in the first peripheral area 104. Specifically, the inner dam 108 is disposed in the first peripheral area 104 located at least between the display area 102 and the second peripheral area 106. In the embodiment shown in FIG. 1, the inner dam 108 is disposed in the first peripheral area 104 so as to surround the display area 102.

The outer dam 110 is disposed outside the inner dam 108. Specifically, the outer dam 110 is disposed outside the inner dam 108 in the first peripheral area 104 located at least between the display area 102 and the second peripheral area 106. In the embodiment shown in FIG. 1, the outer dam 110 is disposed to surround the inner dam 108 in the first peripheral area 104.

The resin part 112 is formed between the inner dam 108 and the outer dam 110 so as to be higher than the inner dam 108 and outer dam 110. Specifically, as shown in FIG. 1 for example, the resin part 112 is formed in the entire area sandwiched between the inner dam 108 and the outer dam 110.

The touch sensor includes a plurality of electrodes 114, connecting wires 116, routing wires, and a part of the drive IC 126, and detects the touched position. The electrodes 114 are disposed to overlap with a sealing film 418 to be described later. Specifically, the electrodes 114 are overlapped with the sealing film 418 disposed in the display area 102, and includes a plurality of pairs of drive electrodes and detection electrodes. The plurality of pairs of drive electrodes and detection electrodes are spaced apart in the X and Y directions to generate electrostatic capacitance. For example, the drive electrodes are a plurality of electrodes 114 each having a rhombic shape and arranged in the X direction and the Y direction. The drive electrodes arranged in the X direction are electrically connected to one another by the connecting wires 116 for connecting the rhombic portions of the drive electrodes. In contrast, the drive electrodes arranged in the Y direction are not electrically connected.

The detection electrodes are a plurality of electrodes 114 each having a rhombic shape and arranged in the X direction and the Y direction. The detection electrodes arranged in the X direction are not electrically connected. In contrast, the detection electrodes arranged in the Y direction are electrically connected by the connecting wires 116 for connecting the rhombic portions of the detection electrodes. The drive electrode and the detection electrode may have a shape other than a rhombic shape.

Figure 8A:
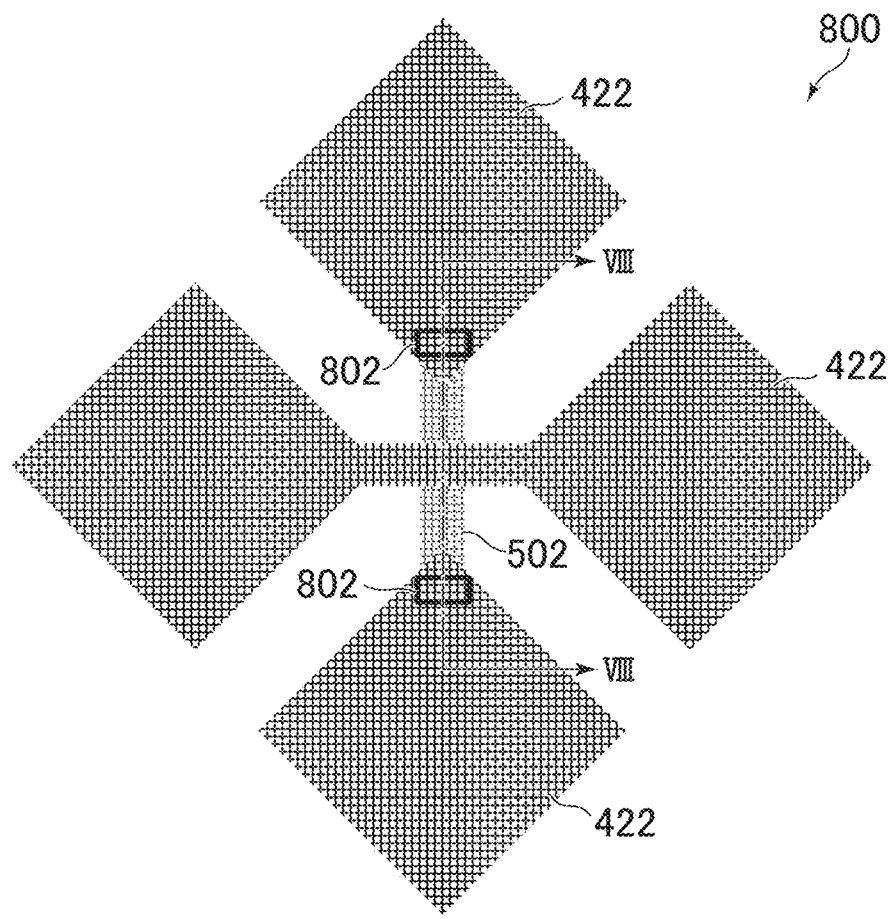
FIG. 8A is a diagram illustrating planar shapes of a first electrode layer and a second electrode layer.
Figure 8B:
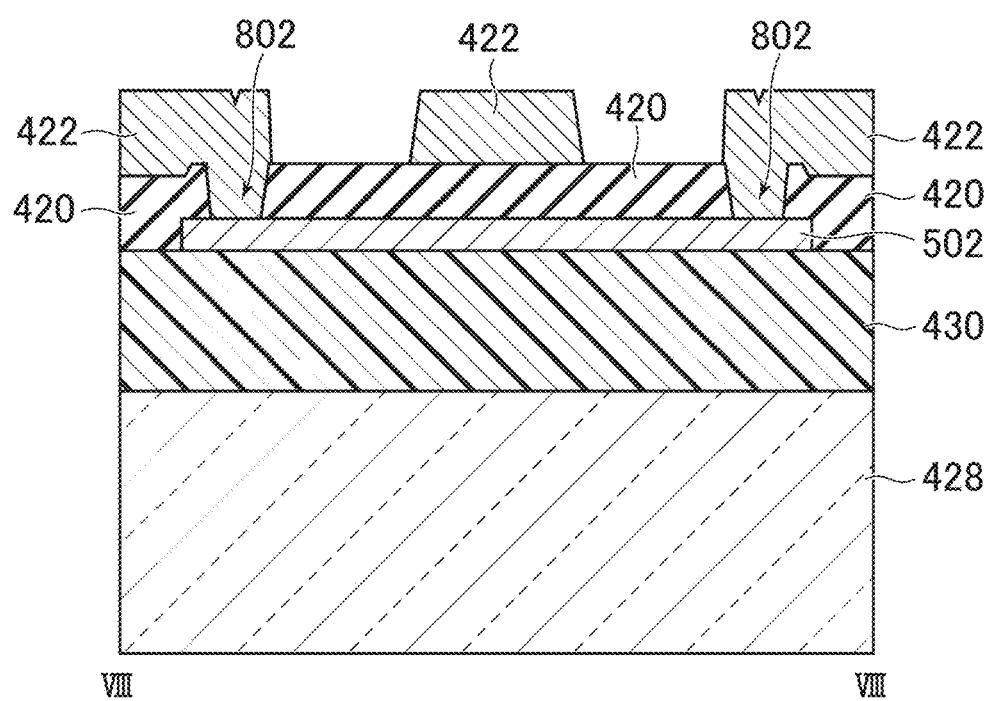
FIG. 8B is a diagram illustrating a cross section taken along the line VIII-VIII of the display device.

The connecting wires 116 for connecting the drive electrodes arranged in the X direction and the connecting wires 116 for connecting the detection electrodes arranged in the Y direction are formed in different layers (see FIG. 8B). As such, the drive electrodes and the detection electrodes are formed so as not to be electrically connected. The pairs of drive electrodes and detection electrodes are disposed close to each other such that each of the electrodes functions as an electrode of a capacitor to form a capacitance.

The electrode 114 is formed in a mesh shape. Specifically, holes provided in the electrode 114 are disposed at a position overlapping the light-emitting area so that the electrode 114 does not block the light emitted from the pixels. The electrode 114 is formed in a mesh shape, and thus can be made of a metal having a small electrical resistance. Further, the sensitivity of the touch sensor can be improved by reducing the electrical resistance of the electrode 114.

The routing wires are electrically connected to the electrodes 114 and disposed in the first peripheral area 104. Specifically, one routing wire is disposed in each column and each row of the electrically connected drive electrode and the detection electrode. Each routing wire is electrically connects the terminal part 122 with the electrode 114 via the first peripheral area 104 and the second peripheral area 106. In the first peripheral area 104, the routing wire is disposed on the inner dam 108, the resin part 112, and the outer dam 110. As shown in FIG. 1, the routing wires may include a first routing wire 118 and a second routing wire 120 that are disposed in different layers, and the first routing wire 118 and the second routing wire 120 may be connected in the first peripheral area 104.

The touch sensor detects the touched position based on the voltage of the detection electrode that varies according to a signal entered in the drive electrode. Specifically, a drive signal is entered in the drive electrode. The voltage of the detection electrode varies according to the driving signal via the capacitance. The touch sensor detects the touched position based on the voltage change of the detection electrode.

The FPC 124 is connected to the terminal part 122. The FPC 124 is formed of a resin and has flexibility.

The drive IC 126 is disposed in the FPC 124 and supplies power and signals to the touch sensor and the circuits formed in the display area 102. Specifically, for example, the drive IC 126 applies a potential for conducting between the source and drain electrodes with respect to the scanning signal lines of the pixel transistors disposed corresponding to respective sub-pixels forming one pixel, and supplies a current corresponding to the gradation value of the sub-pixel to each pixel transistor data signal line. The display device 100 displays an image in the display area 102 by the drive IC 126. The drive IC 126 generates a signal that is fed into the drive electrode, and detects the touched position based on the voltage of the detection electrode.

Figure 2:
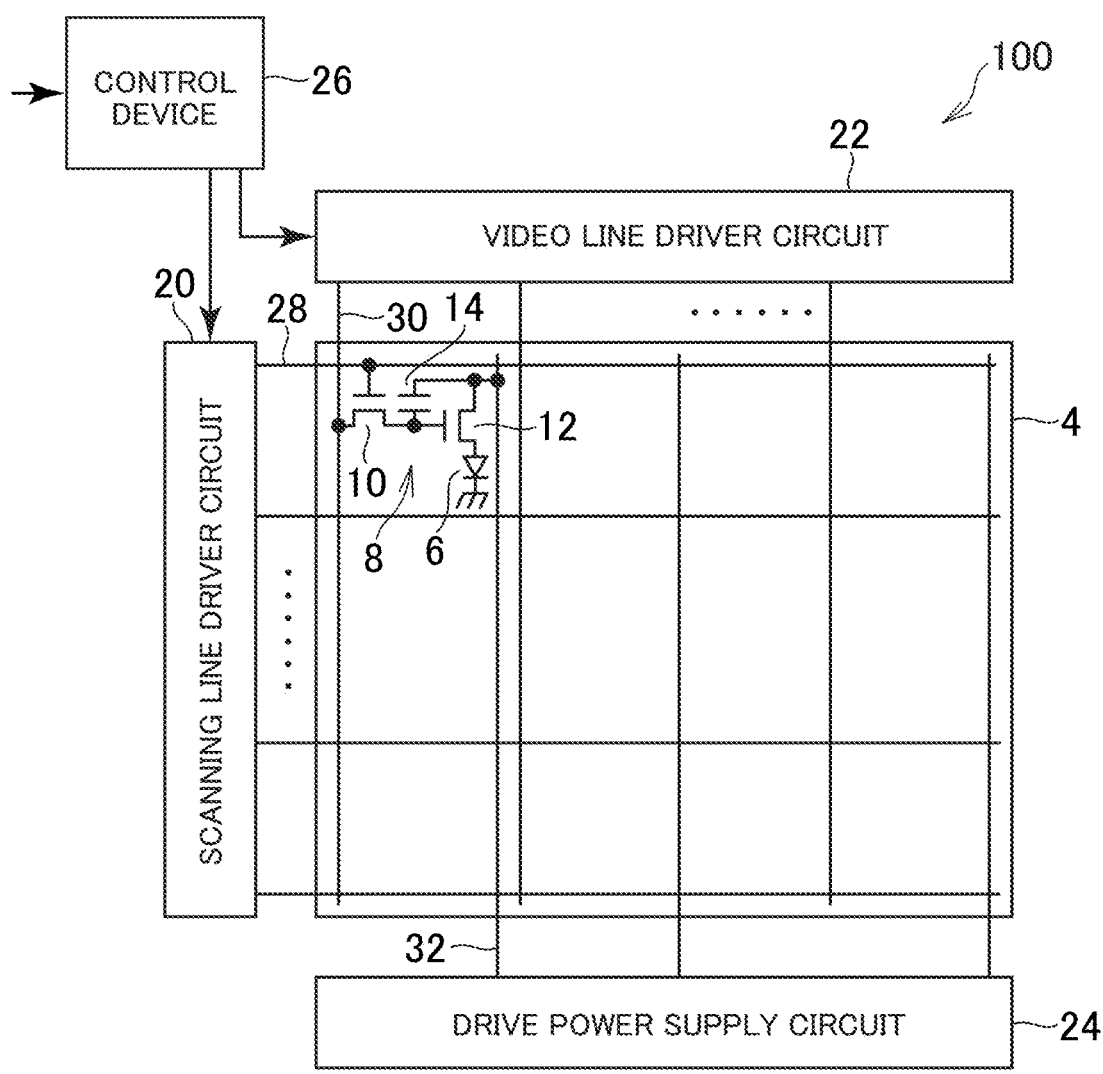
FIG. 2 is a schematic diagram illustrating a pixel circuit and peripheral circuits.

FIG. 2 is a schematic diagram illustrating a pixel circuit and peripheral circuits included in the display device 100. The display device 100 includes a pixel array unit 4 for displaying an image, and a driving unit for driving the pixel array unit 4.

In the pixel array unit 4, an organic light-emitting diode 6 and a pixel circuit 8 are arranged in the form of a matrix corresponding to each pixel. The pixel circuit 8 includes a lighting TFT (thin film transistor) 10, a drive TFT 12, and a capacitor 14, for example.

The drive unit includes a scanning line driver circuit 20, a video line driver circuit 22, a drive power supply circuit 24, and a control device 26. The drive unit drives the pixel circuit 8 and controls the light emission by the organic light-emitting diode 6.

The scanning line driver circuit 20 is connected to a scanning signal line 28 provided for each horizontal pixel array (pixel row). The scanning line driver circuit sequentially selects the scanning signal line 28 in response to a timing signal entered from the control device 26, and applies a voltage to the selected scanning signal line 28 to turn on the lighting TFT 10.

The video line driver circuit 22 is connected to a video signal line 30 provided for each vertical pixel array (pixel column). The video line driver circuit 22 receives a video signal from the control device 26, and, in accordance with the selection of the scanning signal line by the scanning line driver circuit 20, outputs a voltage corresponding to the video signal in the selected pixel row to each video signal line 30. The voltage is applied to the capacitor 14 via the lighting TFT 10 at the selected pixel row. The drive TFT 12 supplies a current corresponding to the applied voltage to the organic light-emitting diode 6, whereby the organic light-emitting diode 6 of the pixel corresponding to the selected scanning signal line 28 emits light.

The drive power supply circuit 24 is connected to a drive power supply line 32 provided for each pixel column, and supplies a current to the organic light-emitting diode 6 via the drive power supply line 32 and the drive TFT 12 in the selected pixel row.

Here, a lower electrode of the organic light-emitting diode 6 is connected to the drive TFT 12. An upper electrode 416 (see FIG. 4) of each organic light-emitting diode 6 is formed of an electrode common to the organic light-emitting diodes 6 of all the pixels. When the lower electrode 410 (see FIG. 4) is formed as an anode, a high electric potential is entered in the lower electrode. In this case, the upper electrode 416 is a cathode and supplied with a low electric potential. When the lower electrode 410 is formed as a cathode, a low electric potential is entered in the lower electrode. In this case, the upper electrode 416 is an anode and supplied with a high electric potential.

Figure 3:
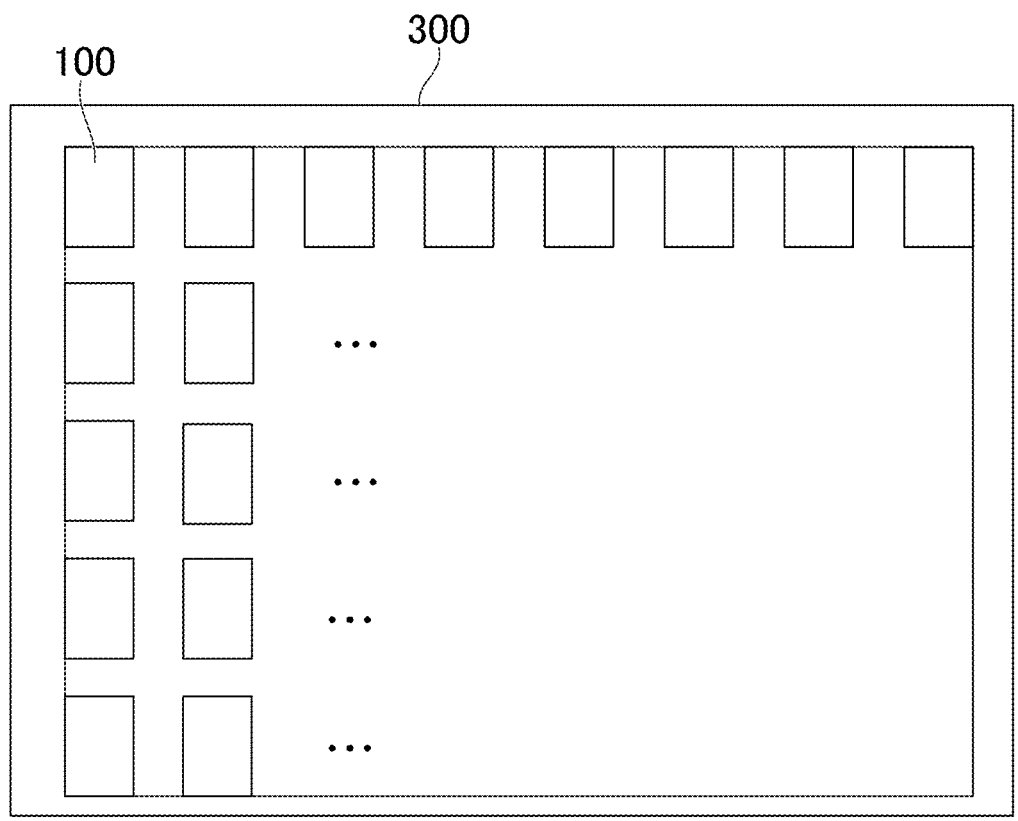
FIG. 3 is a diagram illustrating the relationship between a large plate and individual pieces of a substrate.

The display device 100 is an individual piece cut out from a large plate 300 on which a plurality of display devices 100 are disposed. Specifically, as shown in FIG. 3, a plurality of display devices 100 are disposed on one large plate 300 before the display devices 100 are separated. As described later, a display device 100 is formed by being cut out from the large plate 300 after the circuit is formed in the display area 102 in the state of the large plate 300. Accordingly, a part of the outer edge of the first peripheral area 104 is a cut surface of the large plate 300.

Figure 4:
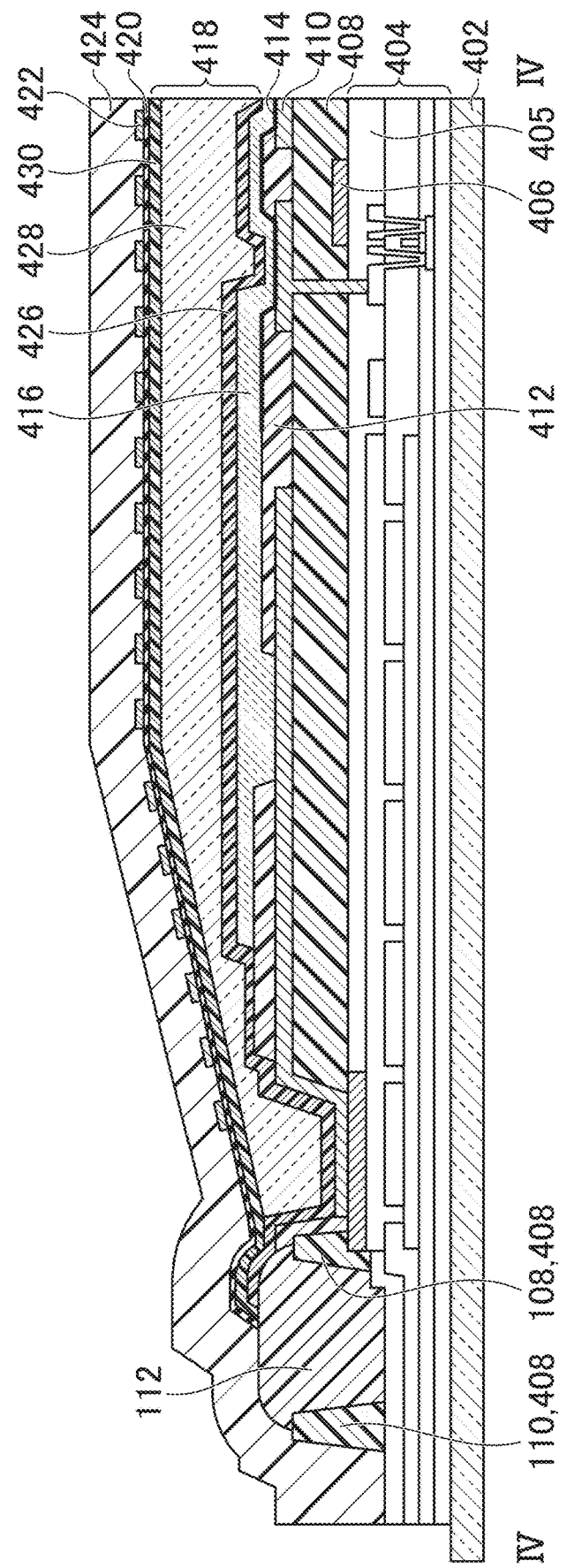
FIG. 4 is a diagram for illustrating a cross section taken along the line IV-IV of the display device.
Figure 5:
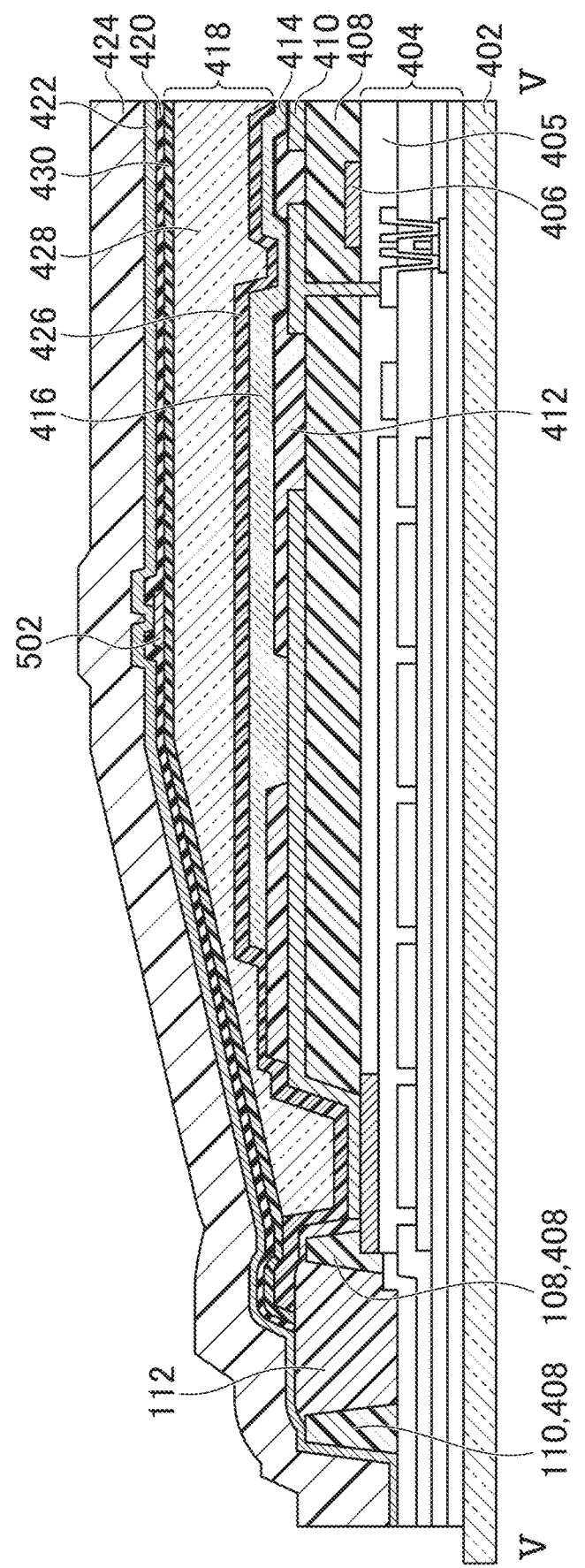
FIG. 5 is a diagram illustrating a cross section taken along the line V-V of the display device.
Figure 6:
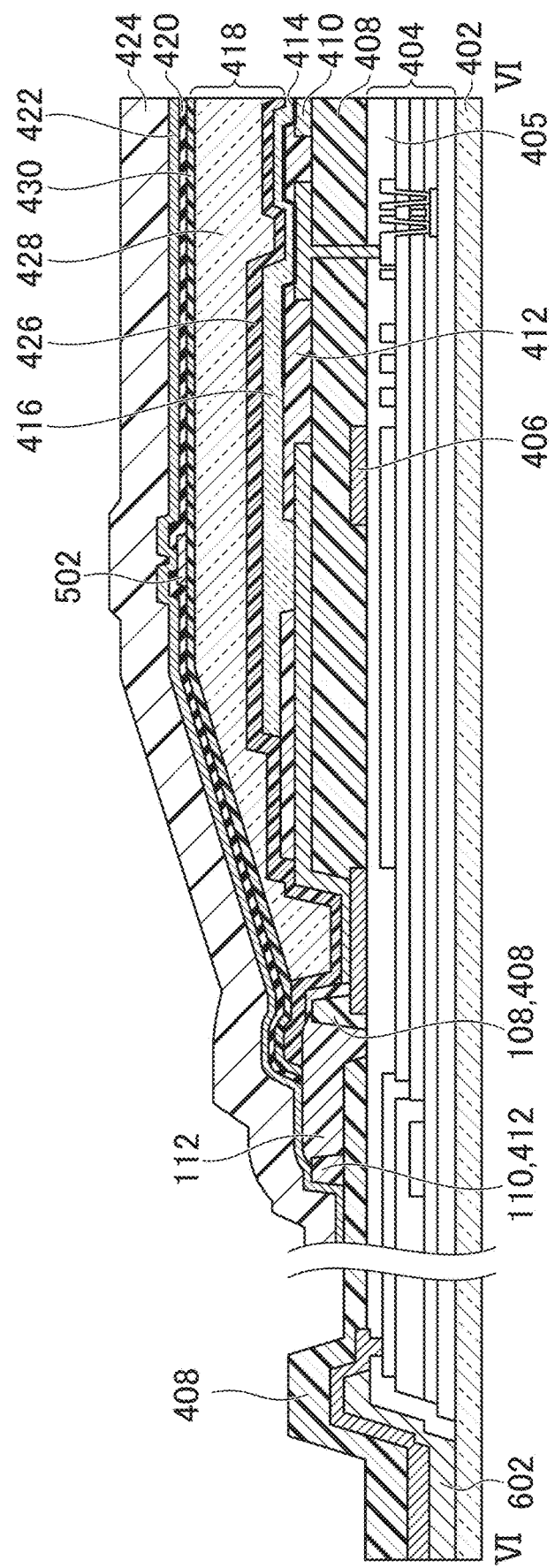
FIG. 6 is a diagram illustrating a cross section taken along the line VI-VI of the display device.
Figure 7:
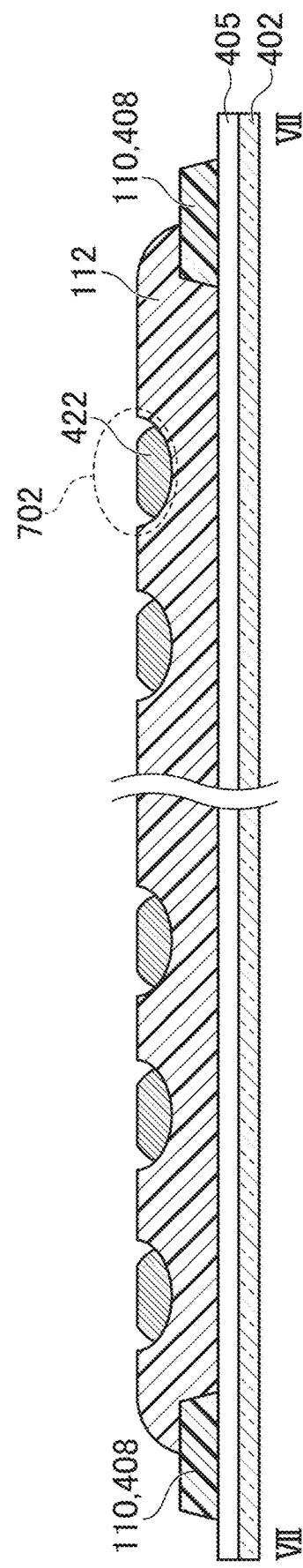
FIG. 7 is a diagram illustrating a cross section taken along the line VII-VII of the display device.

Next, a cross section of the display device 100 will be described. FIG. 4 shows a IV-IV cross section of FIG. 1. FIG. 5 shows a V-V cross section of FIG. 1. FIG. 6 shows a VI-VI cross section of FIG. 1. FIG. 7 shows a VII-VII cross section of FIG. 1. FIG. 8A is an enlarged view of a potion 800 of FIG. 1. FIG. 8B shows a VIII-VIII cross section of FIGS. 1 and 8A. FIG. 1 shows plurality of the connecting wire 116 and plurality of the electrodes 114. In this regard, FIG. 8A is different from FIG. 1 in that FIG. 8A shows a first electrode layer 502 and a second electrode layer 422. FIG. 8B is a diagram in which a layer below a sealing flattening film 428 is omitted.

As shown in FIGS. 4 to 8B, the display device 100 includes a substrate 402, a circuit layer 404, a third metal 406, a first flattening film 408, a second flattening film 602, a resin part 112, a lower electrode 410, a rib 412, an EL layer 414, an upper electrode 416, a sealing film 418, a first electrode layer 502, an inter-sensor insulating layer 420, a second electrode layer 422, and an overcoat 424. In FIGS. 4 to 7, elements such as a spacer 910 shown in FIG. 9 are omitted.

The substrate 402 is formed of glass or a flexible material such as polyimide. The use of the flexible material allows the display device 100 to be curved.

The circuit layer 404 includes, for example, an insulating layer, a source electrode, a drain electrode, a gate electrode, a semiconductor layer, and a passivation layer 405 on the substrate 402. The transistor is formed of the source electrode, the drain electrode, the gate electrode, and the semiconductor layer. The transistor controls the current flowing through the EL layer 414 formed in the pixel, for example.

Third metal 406 is disposed on a passivation layer 405 included in the circuit layer 404. Specifically, the third metal 406 is disposed on the passivation layer 405 in the display area 102. Further, the third metal 406 is disposed on the source electrode and the second flattening film 602 in an area of the first peripheral area 104 where the passivation layer 405 is not provided. The third metal 406 disposed in the first peripheral area 104 is exposed at the terminal part 122.

The first flattening film 408 is disposed in the display area 102 and the first peripheral area 104. Specifically, the first flattening film 408 is disposed on the circuit layer 404 and the third metal 406 in the display area 102. The first flattening film 408 disposed in the display area 102 prevents short-circuiting between the lower electrode 410 and the electrode included in the circuit layer 404, and flattens a step due to the wiring or the transistor disposed in the circuit layer 404.

The first flattening film 408 is separately disposed at two positions in the first peripheral area 104. Specifically, as shown in FIGS. 4 to 6, the first flattening film 408 is formed into a protruded shape at two positions in a cross-sectional view apart from each other in the first peripheral area 104. The inner first flattening film 408, which is one of the first flattening films 408 disposed at the two positions in the first peripheral area 104, is formed as the inner dam 108 for blocking the sealing flattening film 428. The outer first flattening film 408 is formed as a part of the outer dam 110. The first flattening films 408 formed at the two positions in the first peripheral area 104 are formed so as to surround the display area 102 in a plan view. The inner dam 108 and the outer dam 110 are preferably formed to have a height of 20 μm to 50 μm. The distance between the outer edge of the inner dam 108 and the inner edge of the outer dam 110 is preferably 150 μm or less.

The second flattening layer 602 is disposed in the first peripheral area 104. Specifically, as shown in FIG. 6, the second flattening layer 602 is disposed on the passivation layer 405 and the substrate 402 in the first peripheral area 104. The second flattening film 602 flattens the step of the lower layer, thereby preventing disconnection of the third metal 406 disposed above.

The resin part 112 is formed higher than the inner dam 108 and the outer dam 110 between the inner dam 108 and the outer dam 110. Specifically, as shown in FIGS. 4 to 6, the resin part 112 is disposed between the inner dam 108 and the outer dam 110 so as to surround the display area 102. The resin part 112 is formed higher than the inner dam 108 and the outer dam 110. The outer edge of the resin part 112 on the inner dam 108 side is positioned on the inner dam 108, and the outer edge of the resin part 112 on the outer dam 110 side is positioned on the outer dam 110. The outer edge of the resin part 112 on the outer dam 110 side may be located outside the outer dam 110 if the outer edge of the resin part 112 on the outer dam 110 side is located inside the outer edge of the display device 100.

The resin part 112 has a recess 702 in an area overlapping with a routing wire in a plan view. Specifically, as shown in FIG. 7, the resin part 112 has the same number of recesses 702 as the routing wires. The resin part 112 in the area that is not overlapping with the routing wire as shown in FIG. 4 is formed higher than the resin part 112 in the area that is overlapping with the routing wire as shown in FIG. 5. The routing wire is disposed on the recess 702. FIG. 7 shows a cross section of the side along the Y direction, although the recess 702 is also provided on the side along the X direction of the resin part 112.

The lower electrode 410 is disposed on the first flattening film 408. Specifically, the lower electrode 410 is formed in the display area 102 so as to be electrically connected to the source electrode or the drain electrode of the transistor formed in the circuit layer 404 through the contact hole formed in the first flattening film 408.

The rib 412 is disposed on the first flattening film 408. Specifically, the rib 412 is formed in the display area 102 so as to surround an area where the EL layer 414 emits light.

As shown in FIG. 6, the rib 412 disposed in the first peripheral area 104 is formed as a part of the outer dam 110.

The EL layer 414 is formed on the lower electrode 410. Specifically, the EL layer 414 is formed on the lower electrode 410 and the edge of the rib 412 in the display area 102. The EL layer 414 is formed by laminating a hole injection layer, a hole transport layer, a light emitting layer, an electron transport layer, and an electron injection layer. The light emitting layer emits light when the hole injected from the lower electrode 410 and the electron injected from the upper electrode 416 are recombined, for example. The hole injection layer, the hole transport layer, the electron transport layer, and the electron injection layer are the same as those in the related art, and thus the description thereof is omitted. In the present embodiment, the light emitting layer is formed using a material that emits light of red, green, and blue.

The upper electrode 416 is formed on the EL layer 414 and flows a current between the upper electrode 416 and the lower electrode 410 to make the light-emitting layer included in the EL layer 414 to emit light. The upper electrode 416 is formed of, for example, a transparent conductive film including metal such as ITO and IZO or a metal thin film having optical transparency made of AgMg.

The sealing film 418 is disposed so as to overlap with the display area 102 in a plan view. Specifically, the sealing film 418 is disposed so as to cover the entire display area 102 and a part of the first peripheral area 104. The outer edge of the sealing film 418 on the second peripheral area 106 side is located on the resin part 112 or the outer dam 110.

The sealing film 418 includes a lower barrier film 426, a sealing flattening film 428, and an upper barrier film 430. Specifically, the lower barrier film 426 is formed so as to cover the upper electrode 416 in the display area 102. The sealing flattening film 428 is disposed inside the inner dam 108 so as to cover the lower barrier film 426. The sealing flattening film 428 flattens the unevenness of the lower barrier film 426. The upper barrier film 430 is formed so as to cover the lower barrier film 426 and the sealing flattening film 428. The lower barrier film 426 and the upper barrier film 430 are formed of an inorganic material impermeable to moisture, such as SiN. The sealing flattening film 428 is formed of, for example, acrylic and epoxy. The sealing film 418 prevents moisture from penetrating into the EL layer 414, and thereby prevents deterioration of the EL layer 414. The sealing film 418 is not limited to the above-described configuration, and may be formed of one layer or two layers, or may be formed of four or more layers.

The outer edges of the lower barrier film 426 and the upper barrier film 430 on the second peripheral area 106 side are located on the resin part 112 or the outer dam 110. In FIG. 4, the outer edges of the lower barrier film 426 and the upper barrier film 430 on the second peripheral area 106 side are located on the resin part 112.

The first electrode layer 502 is disposed on the sealing film 418. Specifically, the first electrode layer 502 is a connecting wire 116 for electrically connecting a plurality of electrodes 114 arranged in the Y direction. As shown in FIG. 8B, the first electrode layer 502 is electrically connected to the second electrode layer 422 through the contact hole 802 provided in the inter-sensor insulating layer 420. The first electrode layer 502 is supplied with a drive signal or outputs a detection signal through the second electrode layer 422. As shown in FIG. 8B, the first electrode layer 502 provided in the area where the connecting wire 116 overlaps in a plan view electrically connects the electrodes 114 arranged in the Y direction. The second electrode layer 422 connected to the first electrode layer 502 is a part of the routing wire. FIG. 4 is a cross-sectional view of an area where the first electrode layer 502 is not disposed.

The inter-sensor insulating layer 420 is disposed on the first electrode layer 502. Specifically, as shown in FIGS. 4 to 6, the inter-sensor insulating layer 420 is disposed so as to cover the sealing film 418 in an area where the first electrode layer 502 is not disposed. The inter-sensor insulating layer 420 is disposed so as to cover the first electrode layer 502 except for an area where the contact hole 802 is provided (see FIGS. 5, 6, 8B). As shown in FIG. 8B, in an area where the connecting wire 116 overlaps in a plan view, the drive electrode and the detection electrode (the first electrode layer 502 and the second electrode layer 422) are formed so as not to be electrically connected by the inter-sensor insulating layer 420.

The second electrode layer 422 is disposed on the inter-sensor insulating layer 420. Specifically, as shown in FIG. 4, the second electrode layer 422 is disposed on the inter-sensor insulating layer 420 at regular intervals. A gap where the second electrode layer 422 is not disposed is a mesh hole. Further, as shown in FIGS. 5 and 6, the second electrode layer 422 is continuously formed in the cross-section of the area that is formed in being extended in the X direction. As shown in FIG. 8B, the second electrode layer 422 provided in the area where the connecting wire 116 overlaps in a plan view electrically connects the electrodes 114 arranged in the X direction.

As shown in FIGS. 8A and 8B, the connecting wires 116 are arranged in different layers in the area where the connecting wires 116 overlap in a plan view. The connecting wires 116 are composed of the first electrode layer 502 and the second electrode layer 422.

The overcoat 424 is formed on the sealing film 418. The overcoat 424 protects the underlying layers.

Next, the display device 100 being curved will be described. FIG. 9 is a schematic cross section of the display device 100 in the vicinity of the second peripheral area 106. As shown in FIG. 9, the display device 100 includes a substrate 402, a protective film 902, a polarizing plate 904, a reinforcing film 906, a heat diffusion sheet 908, a spacer 910, a FPC 124, and a reinforcing resin 912.

The substrate 402 is curved in the second peripheral area 106. Although not shown in FIG. 9, the layers such as the circuit layer 404 and the sealing film 418 are disposed on the substrate 402.

The protective film 902 is disposed on the substrate 402. The protective film 902 is a film for protecting the layers disposed on the substrate 402.

The polarizing plate 904 reduces the reflection of external light incident on the display device 100. This increases visibility of the display device 100.

The reinforcing film 906 is a film for reinforcing the display device 100. The reinforcing films 906 are disposed on flat areas of the front and back surfaces of the curved display device 100.

The heat diffusion sheet 908 is a sheet for diffusing the heat of the display device 100. Specifically, the heat diffusion sheet 908 diffuses the heat generated by the drive circuit disposed around the display device 100 to the entire display device 100. This prevents the display device 100 from being locally heated.

The spacer 910 is disposed between the front and the back surfaces of the curved display device 100. The spacer 910 keeps the distance between the front surface and the back surface at a certain level or more. This allows the curvature of the second peripheral area 106 to be kept within an allowable range even if the pressure in the thickness direction is applied to the display device 100.

The edge of the spacer 910 is formed to be a curved surface having the curvature corresponding to the back surface of the second peripheral area 106. The edge of the spacer 910 is in contact with the back surface of the second peripheral area 106. This keeps the shape of the second peripheral area 106 even if the pressure is applied to the surface of the second peripheral area 106. The spacer 910 reduces the stress applied to the wiring disposed in the second peripheral area 106, thereby making disconnection of the wiring less likely.

The FPC 124 is connected to the terminal part 122 of the substrate 402. The FPC 124 has a drive IC 126 that controls the lighting of the pixels.

The reinforcing resin 912 is a resin for reinforcing the display device 100. The reinforcing resin 912 is disposed in the second peripheral area 106 of the curved display device 100. The reinforcing resin 912 is applied to the curved area of the display device 100.

The reinforcing resin 912 may not be attached to the second peripheral area 106. Such configuration enables to increase the flexibility of the second peripheral area 106 and bend the display device 100 with a smaller radius of curvature. When the radius of curvature of the second peripheral area 106 is smaller, the size of the curved display device 100 in a plan view is smaller, and the thickness of the curved display device 100 is also smaller.

As described above, according to the present invention, the outer edge of the sealing film 418 on the second peripheral area 106 side is located on the resin part 112 or the outer dam 110. That is, the sealing film 418 is not disposed on the second peripheral area 106 and the cut surfaces of the large plate 300. This prevents the sealing film 418 from being cracked due to the bending of the display device 100 or cutting of the large plate 300. As such, it is possible to prevent moisture from intruding through a crack in the sealing film 418 as an intrusion path and deteriorating the display element.

Figure 10A:
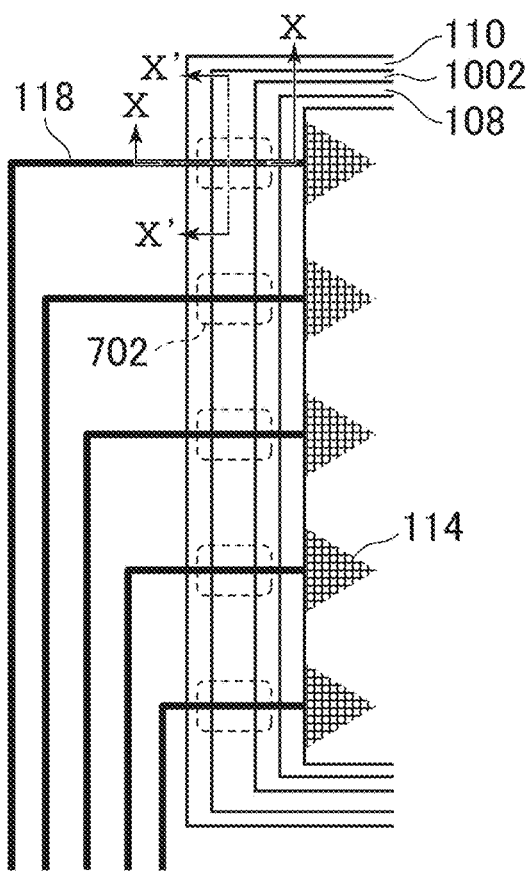
FIG. 10A is a diagram illustrating a modification with a covering resin provided.
Figure 10B:
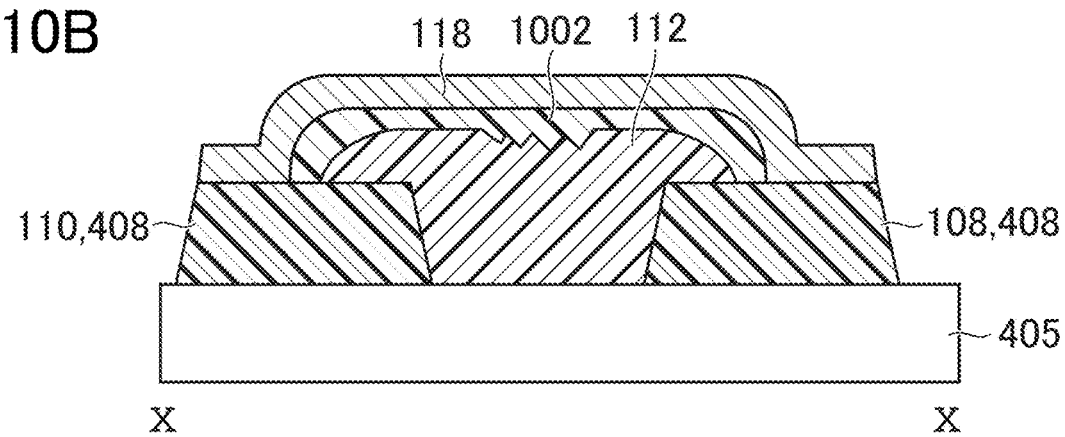
FIG. 10B is a diagram illustrating a modification with a covering resin provided.
Figure 10C:
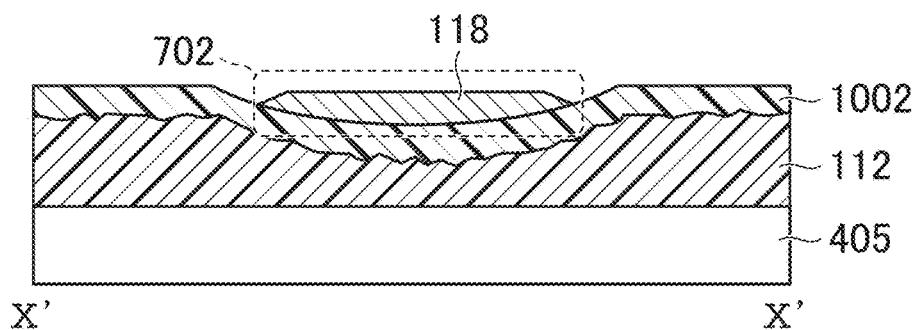
FIG. 10C is a diagram illustrating a modification with a covering resin provided.

As a modification of the above embodiment, a covering resin 1002 may be provided on the resin part 112. FIG. 10A is an enlarged plan view of the left end of the display device 100 according to a modification. FIG. 10B shows a X-X cross-section of FIG. 10A. FIG. 10C shows a X'-X' cross-section of FIG. 10A. As shown in FIGS. 10B and 10C, when a mask 1302 (see FIG. 13) is disposed on the upper surface of the resin part 112, the upper surface of the resin part 112 may be damaged. In the present modification, the covering resin 1002 is provided on the resin part 112 so as to flatten the unevenness caused by the damages.

Specifically, as shown in FIGS. 10A to 10C, the covering resin 1002 is disposed between the inner dam 108 and the outer dam 110 so as to cover the entire resin part 112. A recess 702 is provided for each first routing wire 118. The covering resin 1002 flattens the lower layer of the first routing wire 118, and thereby preventing disconnection of the first routing wire 118 due to unevenness of the damages.

Figure 11A:
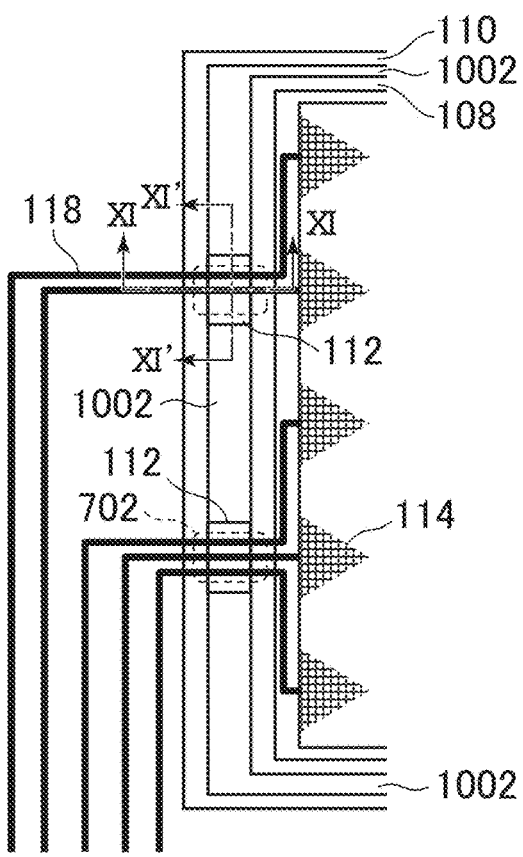
FIG. 11A is a diagram illustrating another modification with a covering resin provided.
Figure 11B:
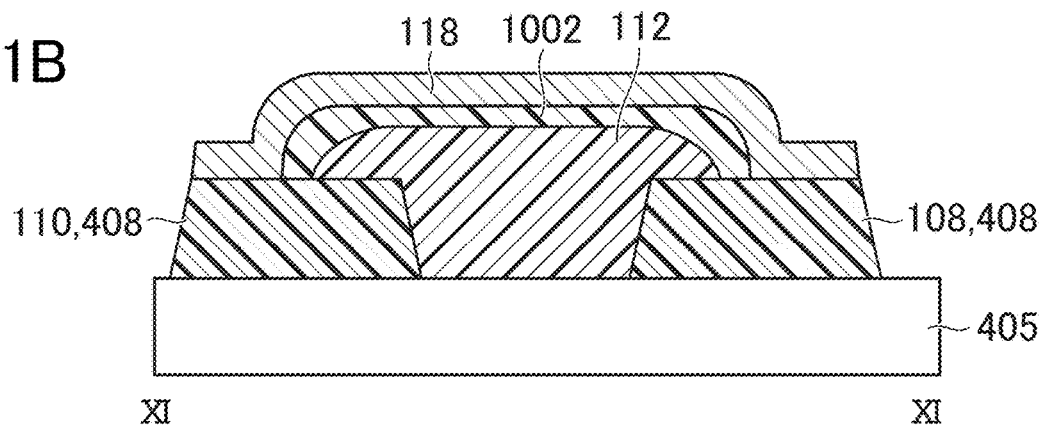
FIG. 11B is a diagram illustrating another modification with a covering resin provided.
Figure 11C:
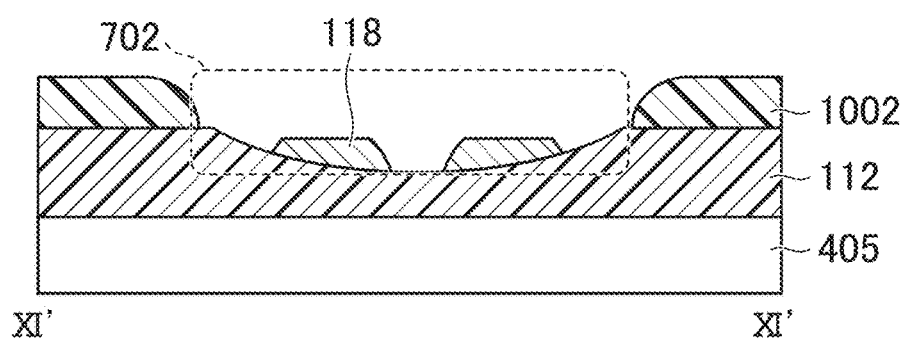
FIG. 11C is a diagram illustrating another modification with a covering resin provided.

FIG. 11A is an enlarged plan view of the left end portion of the display device 100 according to another modification. FIG. 11B shows a XI-XI cross-section of FIG. 11A. FIG. 11C shows XI'-XI' cross-section of FIG. 11A. In the present modification, the covering resin 1002 is disposed between the inner dam 108 and the outer dam 110 so as to cover the entire resin part 112 except for the area where the recess is provided.

A recess 702 is provided for each of the plurality of first routing wires 118. In the example shown in FIG. 11A, two recesses 702 are provided. The first routing wire 118 is arranged so as to pass through the area where the recess 702 is provided. In the example shown in FIG. 11A, two first routing wires 118 are disposed in the upper recess 702, and three first routing wires 118 are disposed in the lower recess 702.

In this modification, the mask 1302 is disposed on the upper surface of the covering resin 1002. The covering resin 1002 allows the depth of the recess 702 to increase. As such, in a case where the mask 1302 is disposed on the upper surface of the covering resin 1002, it is possible to prevent the mask 1302 from being in contact with the surface of the resin part 112 and causing unevenness on the surface of the resin part 112. Accordingly, the lower layer of the first routing wire 118 is flat, and this serves to prevent disconnection of the first routing wire 118 due to the unevenness of damages.

The layout of the first routing wire 118 and the recess 702 is not limited to be applied to the modification, and may be applied to the above embodiment. Further, the number of recesses 702 and the number of first routing wires 118 disposed in one recess 702 are not limited to the above examples.

Figure 12:
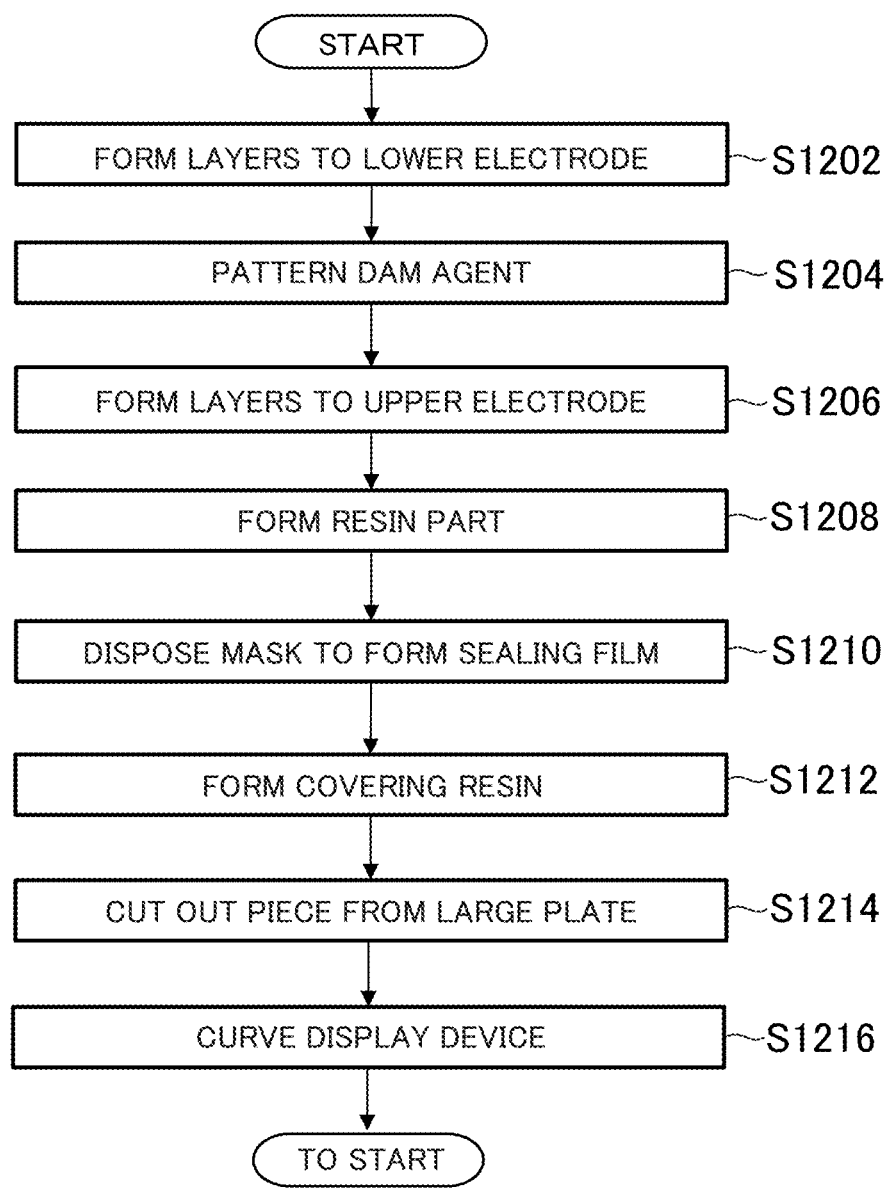
FIG. 12 is a flowchart of a method of manufacturing a display device.

Next, a method of manufacturing the display device 100 will be described. FIG. 12 is a flowchart showing a method of manufacturing the display device 100. First, layers from the circuit layer 404 to the lower electrode 410 are formed (S1202). This step is the same as that of the related art, and thus a detailed description thereof is omitted.

Next, the dam agent is patterned (S1204). Specifically, after the dam agent is disposed in the entire display area 102 and curved area 106, the dam agent is removed from the area other than the first flattening film 408, the inner dam 108, and the area where a part of the outer dam 110 are formed. This results in forming the first flattening film 408, the inner dam 108, and a part of the outer dam 110. The dam agent may be formed into the same shape as described above from the beginning by applying a dam agent, for example.

The layers from the third metal 406 to the upper electrodes 416 are then formed (S1206). Here, a part of the rib 412 is formed as another part of the outer dam 110.

Subsequently, the resin part 112 is formed (S1208). Specifically, the resin part 112 is formed by applying a resin material and then curing it by irradiating ultraviolet rays. The resin part 112 may be formed by other methods if the resin part fills the space between the inner dam 108 and the outer dam 110 and is formed higher than the inner dam 108 and the outer dam 110.

Figure 13:
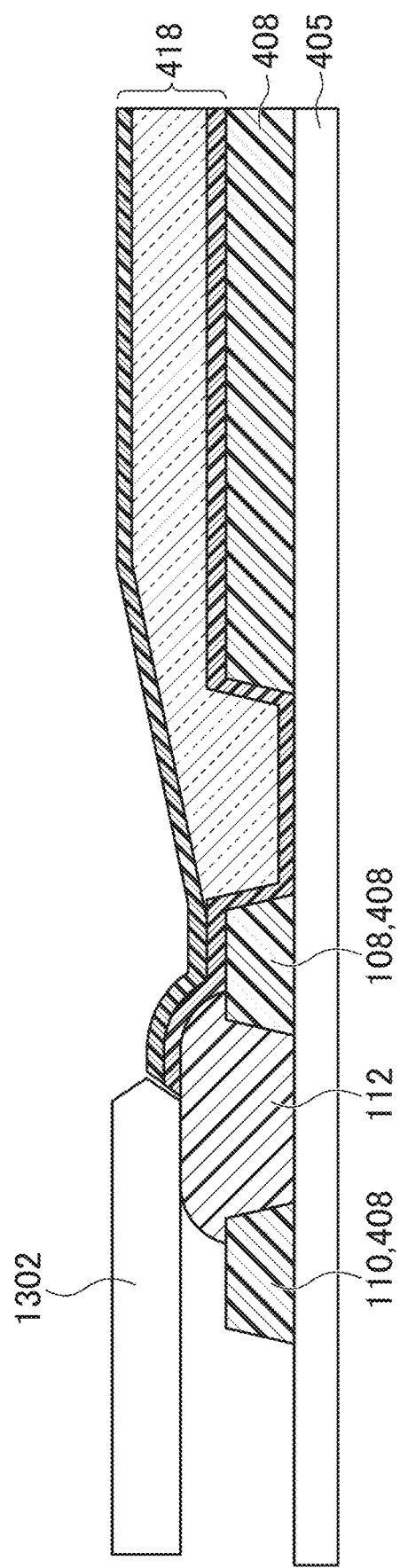
FIG. 13 is a diagram illustrating a method of manufacturing a display device.

Next, the mask 1302 is disposed on the resin part 112, and the sealing film 418 is formed (S1210). Specifically, as shown in FIG. 13, the mask 1302 is disposed in contact with the resin part 112. The mask 1302 has an opening in an area where the sealing film 418 is formed. The lower barrier film 426 is then formed by the CVD method at a position corresponding to the opening of the mask 1302. The sealing flattening film 428 is cured by being irradiated with ultraviolet rays after the liquid resin material is disposed in the display area 102. The liquid resin material is blocked by the inner dam 108, and thus the sealing flattening film 428 is formed inside of the inner dam 108. Similarly to the lower barrier film 426, the upper barrier film 430 is formed by the CVD method at a position corresponding to the opening of the mask 1302.

Next, the mask 1302 is removed, and then the covering resin 1002 is formed (S1212). In S1210, when the mask 1302 is in contact with the resin part 112, the upper surface of the resin part 112 may be damaged. The covering resin 1002 is disposed in the area in contact with the mask 1302.

Next, pieces of the display devices 100 are cut out from the large plate 300 (S1214). A plurality of pieces of the display devices 100 are cut out from one large plate 300. In this regard, the sealing film 418 is formed using the mask 1302 in S1208, and thus there is no sealing film 418 on the cut surface.

The cut out display devices 100 are then curved (S1216). Specifically, the polarizing plate 904, the protective film 902, and the reinforcing film 906 are attached to the display device 100, and then the display device 100 is curved while being pressed by the spacer 910. In this manner, the display device 100 is in a state shown in FIG. 9. In this regard, the sealing film 418 is formed using the mask 1302 in S1208, and thus there is no sealing film 418 in the curved area (second peripheral area 106).

According to the present invention, the sealing film 418 is formed by the CVD method using the mask 1302. The outer edge of the sealing film 418 can be accurately controlled, and thus the sealing film 418 is not disposed on the second peripheral area 106 and the cut surfaces of the large plate 300. As such, it is possible to prevent moisture from intruding through a crack in the sealing film 418 as an intrusion path and deteriorating the display element.

Figure 14:
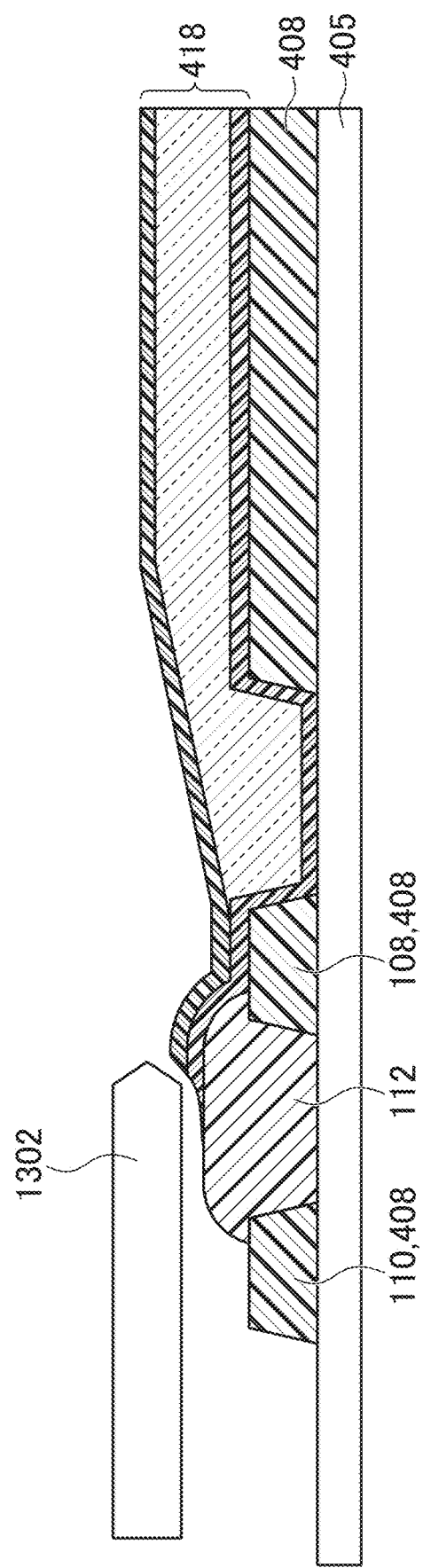
FIG. 14 is a diagram illustrating a method of manufacturing a display device.

As a modification of the above manufacturing method, the sealing film 418 may be formed such that the mask 1302 is not in contact with the resin part 112 in S1210. Specifically, as shown in FIG. 14, the sealing film 418 may be formed such that a gap is provided between the upper surface of the resin part 112 and the mask 1302. In this case, although the sealing film 418 is also formed below the edge of the mask 1302, the outer edge of the sealing film 418 can be controlled more accurately by using the mask 1302 than in the related art. Further, in a case where a gap is provided between the masks 1302 and the resin parts 112, the step of providing the covering resin 1002 (S1212) may be omitted.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
 a display area;
 a first peripheral area disposed outside the display area;
 a second peripheral area disposed outside the first peripheral area;
 an inner dam disposed in the first peripheral area;
 an outer dam disposed outside the inner dam in the first peripheral area;
 a resin part formed between the inner dam and the outer dam so as to be higher than the inner dam and the outer dam;
 a sealing film disposed so as to overlap with the display area in a plan view; and
 a touch sensor including an electrode and a routing wire, the electrode being disposed so as to overlap with the sealing film, the routing wire being electrically connected to the electrode and disposed in the first peripheral area, wherein
 an outer edge of the sealing film is located on the resin part or on the outer dam, and
 the resin part has a recess in an area overlapping the routing wire in a plan view.

2. The display device according to claim 1, further comprising a covering resin disposed on the resin part.

\* \* \* \* \*